(12) United States Patent
Wissman et al.

(10) Patent No.: US 8,633,552 B1
(45) Date of Patent: Jan. 21, 2014

(54) ESD PROTECTION FOR MEMS RESONATOR DEVICES

(75) Inventors: Barry D. Wissman, Ann Arbor, MI (US); Andrew R. Brown, Northville, MI (US); John R. Clark, Howell, MI (US)

(73) Assignee: Micrel, Incorporated, San Jose, CA (US)

( * ) Notice: Subject to any disclaimer, the term of this patent is extended or adjusted under 35 U.S.C. 154(b) by 1117 days.

(21) Appl. No.: 12/041,552

(22) Filed: Mar. 3, 2008

Related U.S. Application Data

(60) Provisional application No. 60/892,372, filed on Mar. 1, 2007.

(51) Int. Cl.
*H01L 29/84* (2006.01)

(52) U.S. Cl.
USPC .................. 257/415; 257/414; 257/E21.211

(58) Field of Classification Search
USPC ............... 257/E21.211, E29.167, E21.511, 257/E33.056, 414–420, 173; 438/48–53, 438/795; 333/486, 197, 154, 200, 186, 188, 333/193; 29/25.35; 73/504.14, 514.32; 216/2; 331/154, 116, 186, 156
See application file for complete search history.

(56) References Cited

U.S. PATENT DOCUMENTS

| | | | |
|---|---|---|---|
| 3,614,678 A * | 10/1971 | Engeler et al. ............... | 333/187 |
| 3,969,640 A * | 7/1976 | Staudte ........................ | 310/312 |
| 5,376,820 A | 12/1994 | Crafts et al. | |
| 5,536,968 A | 7/1996 | Crafts et al. | |
| 6,567,251 B1 * | 5/2003 | Schulte et al. ................. | 361/56 |
| 6,645,145 B1 * | 11/2003 | Dreschel et al. .............. | 600/443 |
| 6,707,351 B2 * | 3/2004 | Gorrell ......................... | 333/188 |
| 6,914,758 B2 | 7/2005 | Ryan et al. | |
| 7,119,995 B2 | 10/2006 | Granstrom et al. | |
| 2003/0222728 A1 * | 12/2003 | Laney et al. .................... | 333/12 |
| 2004/0157364 A1 * | 8/2004 | Combi et al. ................. | 438/106 |
| 2005/0027315 A1 * | 2/2005 | Plateroti ....................... | 606/204 |
| 2006/0006964 A1 * | 1/2006 | Huang et al. .................. | 333/186 |
| 2006/0284307 A1 * | 12/2006 | Baier et al. .................... | 257/723 |
| 2007/0194414 A1 * | 8/2007 | Chou ............................ | 257/678 |
| 2007/0200766 A1 * | 8/2007 | McKinzie et al. ..... | 343/700 MS |
| 2007/0279729 A1 * | 12/2007 | Kothari et al. ................ | 359/291 |
| 2008/0233744 A1 * | 9/2008 | Kaul et al. .................... | 438/684 |

OTHER PUBLICATIONS

Maier-Scheider, et al., "Novel surface-micromachined low-power fuses for on-chip calibration," *Sensors and Actuators A* 97-98, pp. 173-178 (2002).

Chiu, et al., "Fuse-tethers in MEMS," *Journal of Micromechanics and Microengineering*, vol. 16, pp. 480-486 (2006).

* cited by examiner

*Primary Examiner* — Cuong Q Nguyen
*Assistant Examiner* — Yosef Gebreyesus
(74) *Attorney, Agent, or Firm* — Lempia Summerfield Katz LLC

(57) ABSTRACT

Disclosed herein are MEMS resonator device designs and fabrication techniques that provide protection against electrostatic charge imbalances. In one aspect, a MEMS resonator device includes a substrate, an electrode including a first microstructure supported by the substrate, a resonant element including a second microstructure spaced from the first microstructure by a gap for resonant displacement of the second microstructure within the gap during operation, and a disabled shunt coupled to the electrode or the resonant element. The disabled shunt is disabled to enable the resonant displacement but otherwise configured to protect against damage from an electrostatic charge imbalance before the operation of the MEMS resonator device.

15 Claims, 9 Drawing Sheets

ESD PROTECTION FOR MEMS RESONATOR DEVICES

CROSS-REFERENCE TO RELATED APPLICATION

This application claims the benefit of U.S. provisional application entitled "ESD Protection for MEMS Resonators," filed Mar. 1, 2007, and having Ser. No. 60/892,372, the entire disclosure of which is hereby expressly incorporated by reference.

BACKGROUND OF THE DISCLOSURE

1. Field of the Disclosure

The disclosure relates generally to microelectromechanical systems (MEMS) and, more particularly, to MEMS resonator devices.

2. Brief Description of Related Technology

Many types of MEMS resonators are electrostatically actuated. A resonant element of the MEMS device is spaced from stationary electrodes such that the MEMS device is coupled across one or more air gaps. In some designs, the size of the gap between the resonant element and a stationary electrode is significantly less than 1 micron. Vibration of the resonant element varies the spacing between the resonant element and stationary electrodes. To maximize the coupling, the opposing surfaces of the resonant element and stationary electrodes are often large in comparison with the size of the air gap. For example, the surface area in some designs exceeds 1000 $\mu m^2$.

The large opposing surfaces and small air gap have complicated the fabrication of MEMS resonators. For instance, releasing the resonant element has required a wet etch or other steps in which capillary forces can undesirably pull the resonant element into a collapsed, inoperative condition often referred to as stiction. Stiction has long been recognized as a source of yield loss in MEMS device fabrication.

A number of design solutions and fabrication techniques have been proposed and implemented to minimize stiction-based yield losses. Nonetheless, MEMS device yields often remain unsatisfactorily low due to collapsed resonant elements.

SUMMARY OF THE DISCLOSURE

In accordance with one aspect of the disclosure, a MEMS resonator device includes a substrate, an electrode including a first microstructure supported by the substrate, a resonant element including a second microstructure spaced from the first microstructure by a gap for resonant displacement of the second microstructure within the gap during operation, and a disabled shunt coupled to the electrode or the resonant element, the disabled shunt being disabled to enable the resonant displacement but otherwise configured to protect against damage from an electrostatic charge imbalance before the operation of the MEMS resonator device.

In some cases, the disabled shunt is disabled via termination at an edge of the substrate. The disabled shunt may be coupled to a bond pad for the electrode or the resonant element at an end of the disabled shunt opposite of the termination. Alternatively or additionally, the disabled shunt includes a path through the substrate. Alternatively or additionally, the disabled shunt includes a fuse. The fuse may include an air bridge.

The MEMS resonator device may also include a pair of bond pads respectively coupled to the electrode and the resonant element, where the disabled shunt is disposed between the pair of bond pads. Alternatively or additionally, the disabled shunt is connected between the substrate and either the electrode or the resonant element.

In accordance with another aspect of the disclosure, a method is useful for fabricating a MEMS resonator device includes the steps of forming a first microstructure and a second microstructure spaced from the electrode microstructure by a gap and configured for resonant displacement within the gap, forming a shunt coupled to the first microstructure or the second microstructure to protect against damage from an electrostatic charge imbalance during fabrication, and disabling the shunt to enable the resonant displacement of the second microstructure within the gap.

In some cases, the disabling step includes singulating a substrate supporting the first and second microstructures. Alternatively or additionally, the disabling step includes terminating the shunt along a scribe line. Alternatively or additionally, the disabled shunt includes a path through the substrate, such that the disabling step includes grinding the substrate to remove the path.

The shunt forming step may include forming a connection between the shunt and a bond pad for the first or second microstructures.

The shunt forming step may include forming a fuse. The fuse may include an air bridge. The disabling step may include generating a current to flow through the fuse.

In some cases, the method also includes the step of connecting a die having the first and second microstructures to a control circuit, where the current generating step is performed after the connecting step. The method may alternatively or additionally include the steps of packaging the first and second microstructures in a sealed enclosure on a first side of a substrate, and removing material from a second side of the substrate to establish electrical connections to the first and second microstructures, where the current generating step is performed after the material removing step.

BRIEF DESCRIPTION OF THE DRAWING FIGURES

For a more complete understanding of the disclosure, reference should be made to the following detailed description and accompanying drawing figures, in which like reference numerals identify like elements in the figures, and in which.

Figure 11A:
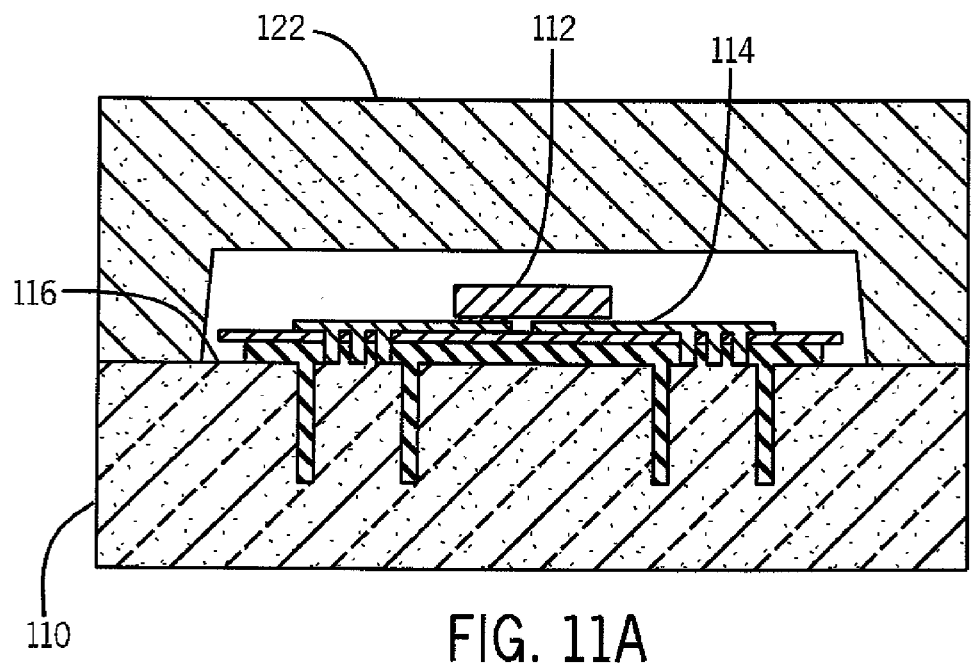
Figure 11B:
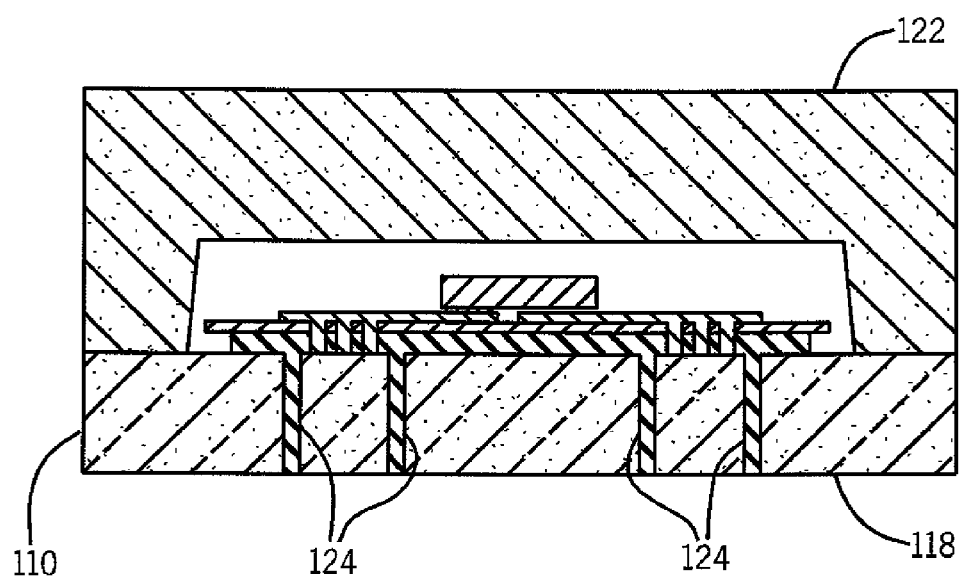
Figure 11C:
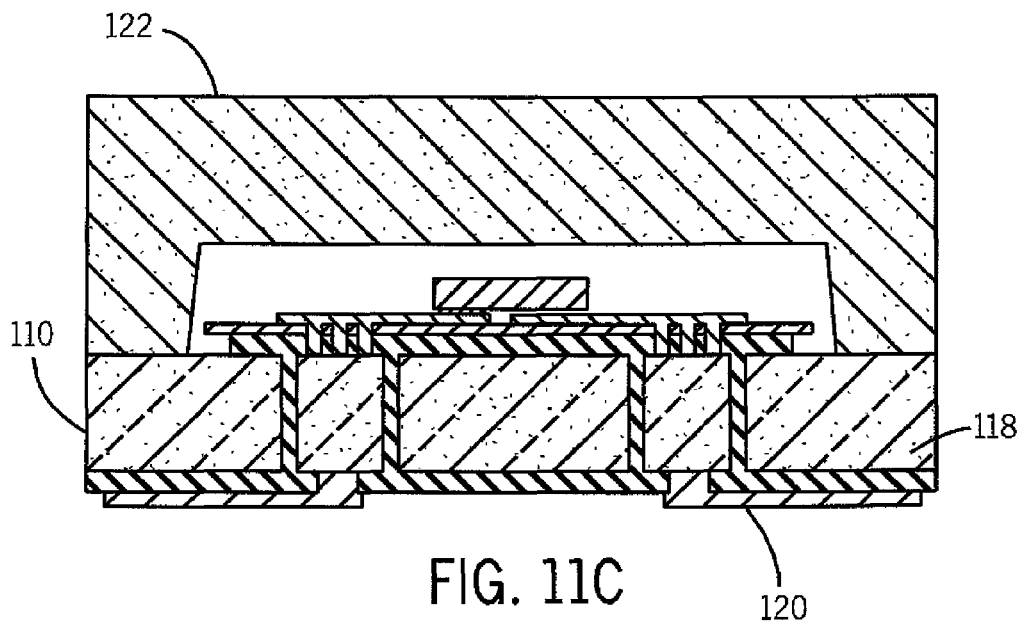
Figure 12:
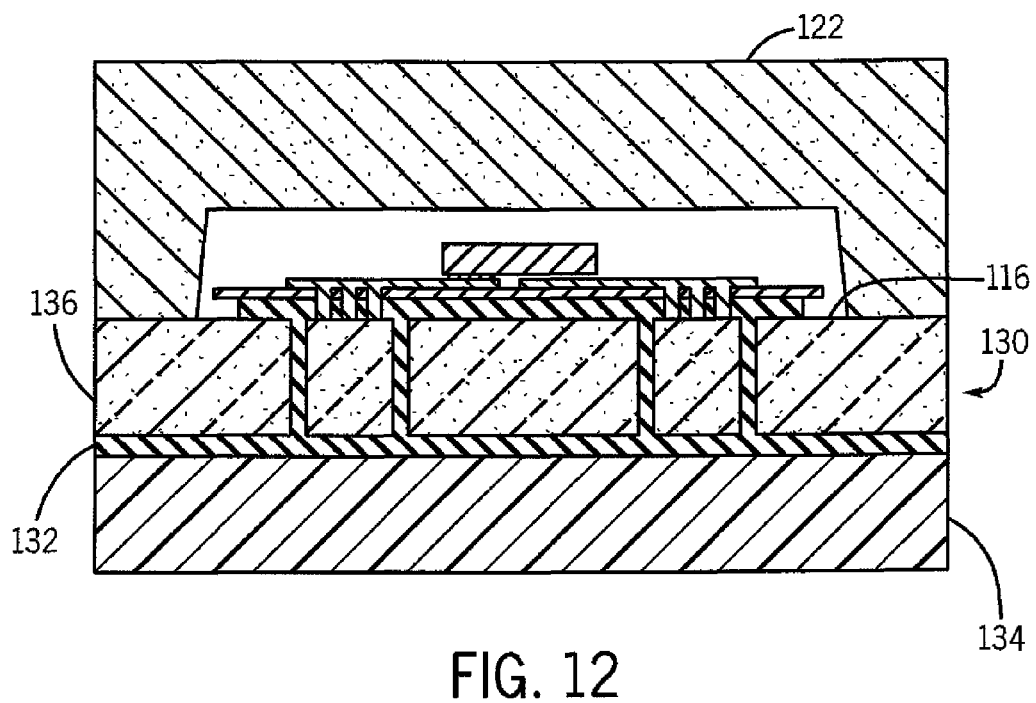

FIGS. 11A-11C are schematic, cross-sectional representations of an exemplary MEMS resonator device during a fabrication sequence in which a substrate provides ESD protection through a backside grinding step and after which encapsulated fuse shunts may be disabled; and FIG. 12 is a schematic, cross-sectional representation of an exemplary MEMS resonator device built on a silicon-on-insulator (SOI) wafer in which the insulator provides ESD protection through the backside grinding step.

While the disclosed systems, devices and methods are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF THE DISCLOSURE

The disclosure generally relates to MEMS resonator devices and methods of fabrication that protect against damage resulting from charge imbalances that may result in, for instance, an electrostatic discharge (ESD) event. The disclosed devices and methods generally include or involve one or more shunts coupled to one or more device elements for protection during fabrication. The shunts are eventually disabled to support or enable device operation. A variety of shunt types and arrangements are described and shown herein.

MEMS resonator devices are sensitive to ESD events. In a typical MEMS resonator design, one or more of the resonator elements are not tied to a fixed electrical potential during fabrication and assembly. This so-called "floating" condition leaves the device susceptible to ESD damage. Complicating matters further, MEMS resonator devices generally include a resonant element released or free to vibrate and one or more fixed electrode elements separated from the vibrating element by a small gap ("free" and "fixed" resonator elements, respectively). An ESD event occurs, for example, when a charged object comes into proximity with one of these device elements, or the corresponding bond pads and interconnecting lines. Any resulting charge imbalance between the free resonant element and a fixed element can create an electrostatic attraction that can be quite strong due to their close proximity. This attraction can be strong enough to overcome the mechanical resilience of the free element, at which point it collapses onto the fixed element. Generally speaking, such mechanical collapse is referred to as "pull-in". Under certain circumstances, subsequent stiction between the two surfaces can cause them to fuse together, rendering the device non-functional. Charge imbalances can also give rise to harmful current flows that damage the device via overheating, electrical over-stress or dielectric breakdown.

Disclosed herein are fabrication techniques and device designs that protect against damage arising from electrostatic charge imbalances. One or more shunts provide conductive lines or paths that tie two or more elements or components of the resonator device (or an adjacent resonator device) to each other and/or to a common ground, such as the substrate. The shunts are generally configured to provide protection by preventing charge imbalances and other ESD events from occurring, thereby protecting the resonator device from damage during fabrication, assembly and other processes or handling preceding operation. To these ends, the shunts may be configured to include low-resistivity current paths and/or connections near the elements of the resonator device. In some cases, the disclosed designs and fabrication methods provide protection before the free element is released, at which point the device becomes particularly susceptible to pull-in and other damage from charge imbalances.

The presence of the shunts (together with any other connected lines or paths) can prevent the device from functioning as intended. Therefore, further aspects of the disclosure address several techniques for, and designs that facilitate, the permanent disabling of the shunts prior to operation of the device. In some cases, the shunts may include one or more sacrificial lines, paths, links or other sections. For example, the shunts may include a fuse link, which may, in turn, include an air bridge to facilitate disabling.

The disclosed techniques and designs reduce or minimize the sensitivity of a variety of MEMS resonator devices to charge imbalances during the fabrication and assembly processes. This can lead to higher product yields, and less-stringent ESD control requirements. Relaxed ESD control requirements will ultimately lead to reduced process complexity, and therefore cost reductions. These and other advantages of the disclosed designs and techniques are not limited to any particular design or type of resonant microstructure, packaging, assembly, or other aspect of a MEMS resonator device.

Figure 1:
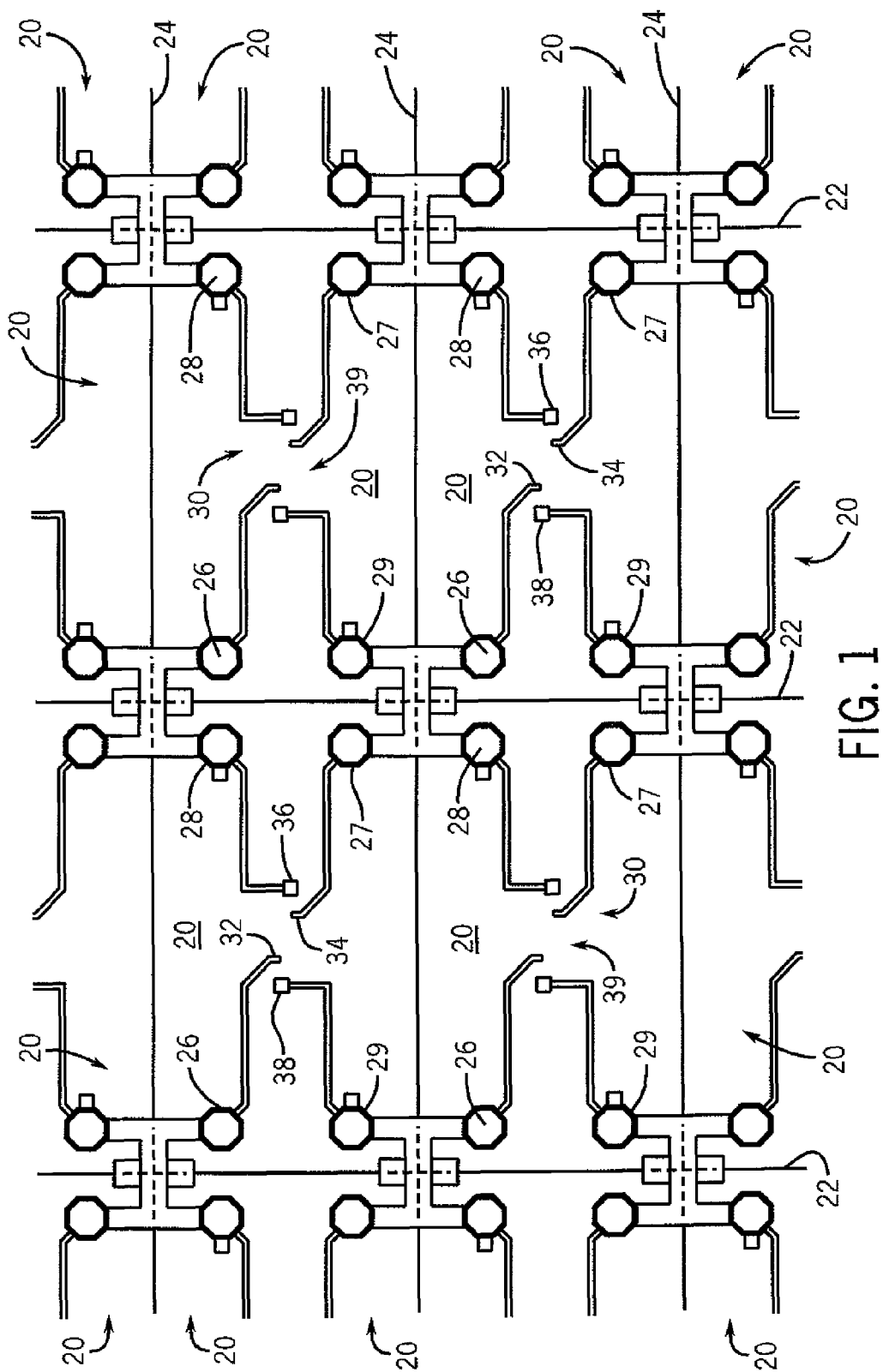
FIG. 1 is a schematic representation of a wafer array of exemplary MEMS resonator devices having shunts disposed at die scribe lines to provide electrostatic discharge (ESD) protection in accordance with one aspect of the disclosure.
Figure 2:
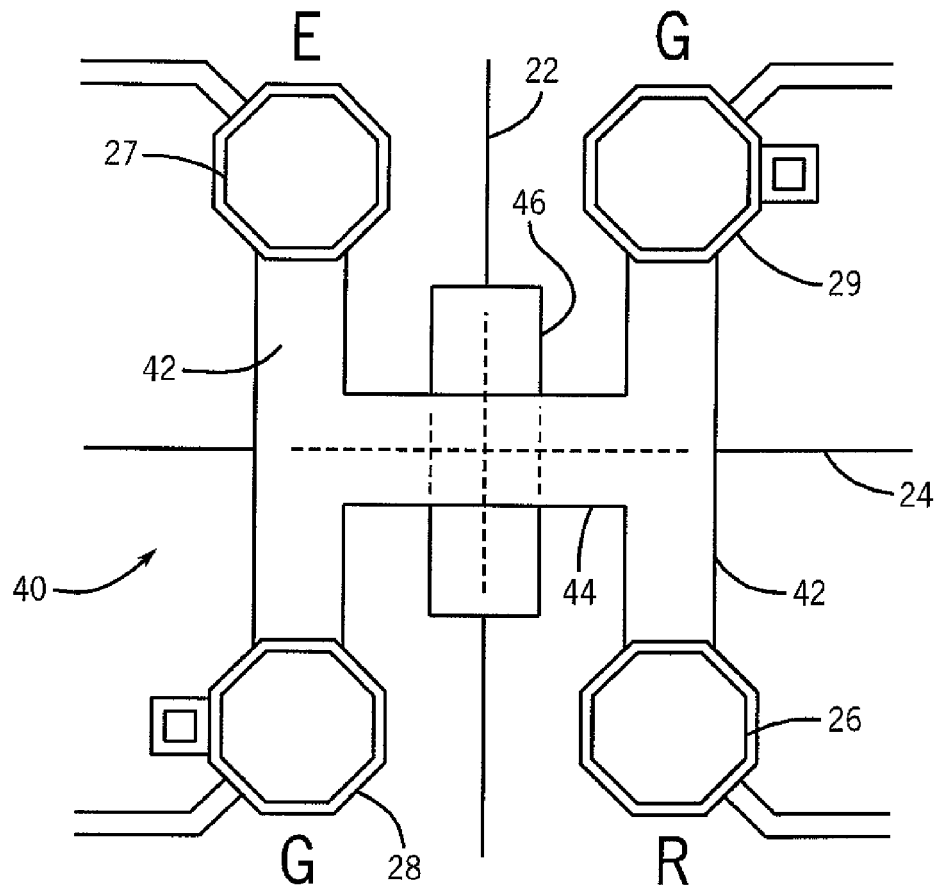
FIG. 2 is a schematic representation of a set of adjacent devices of the array of exemplary MEMS resonator devices of FIG. 1 to show in greater detail the shunts crossing the die scribe lines and connecting bond pads of adjacent MEMS resonator devices.

With reference now to the drawing figures, FIGS. 1 and 2 depict an exemplary shunt arrangement for protection at a wafer level stage of the fabrication process. In this example, each future MEMS resonator device has a plurality of shunt connections at the intersections of, or interfaces with, adjacent resonator devices for protection during fabrication. As best shown in FIG. 1, an array of device dice 20 is arranged in a rectilinear grid pattern defined by intersecting die scribe lines 22 and 24 for subsequent die singulation. With the exception of those at the edge of the wafer (not shown), each die 20 is surrounded by eight adjacent dice 20, four along respective sides of the die 20, and four others at respective corner intersections of the die 20.

The device layout on each die 20 includes bond pads 26-29 disposed at or near respective corners of the die 20. The bond pads 26-29 are connected to respective elements of the MEMS resonator device generally located within a central region 30 of the layout. The central region 30 of the device and the elements therein are shown in schematic and limited fashion for ease in illustration. In this example, the pads 26 and 27 are respectively connected via interconnects to a resonant element microstructure 32 and a drive/sense electrode microstructure 34 spaced from the resonant element 32. The pad 26 may, for instance, be directed to applying a DC bias voltage to the resonant element microstructure 32. The pads 28 and 29 are connected via interconnects to a pair of ground electrode vias 36, 38. The shape, positioning and other characteristics of these device elements in the central region 30 may vary considerably from that depicted. For instance, a gap indicated at 39 between the resonant element 32 and the electrode 34 is depicted as a lateral gap of exaggerated size for ease in illustration. Other resonator configurations suitable for use with the disclosed techniques and designs are arranged with a vertical gap orientation. Eventually, the operation of the device generally involves the resonant displacement of the element 32 in the gap 39, as driven by the electrode 34.

Each of the elements of the MEMS resonator device shown in FIGS. 1 and 2 is generally supported either directly or indirectly by a substrate not shown in these figures for ease in illustration. At the wafer level stage of fabrication, the substrate may include any semiconductor wafer used in the fabrication of MEMS devices. Each of the embodiments described herein is well suited for fabrication upon such standard semiconductor substrates. In some cases, a silicon-on-insulator (SOI) substrate arrangement may be used to provide a handle wafer or other process conveniences. One example involving an SOI wafer is described below.

As best shown in FIG. 2, the shunt arrangement of this exemplary embodiment is generally disposed at or near each corner interface, or scribe line intersection of the wafer grid. The shunt arrangement generally includes a plurality of shunts indicated generally at 40 to connect the pads of adjacent dice 20 (FIG. 1) across the scribe lines 22, 24. In this case, the shunts 40 include a pair of shunts 42 directly connecting two bond pads across the scribe line 24, and a cross-connection shunt 44 connected between the pair of shunts 42, thereby tying the bond pads of four adjacent dice together. As a result, the plurality of shunts 40 are arranged in an H-shaped shunt pattern such that the elements of each resonator device are connected to elements in the eight adjacent dice. Upon die singulation, each of the connections established by the plurality of shunts 40 is cut, thereby disabling each of the shunts. For example, the cross-connection shunt 44 is disposed along the scribe line 24 (to be sliced in half thereby) and across the scribe line 22, such that cuts along each dissect the shunt 44. Until that time, however, the plurality of shunts 40 provide a redundant arrangement for significant capacity to prevent or otherwise address charge imbalances. For instance, the cross-connection shunt 44 establishes a direct path to ground for each resonator element via the ground pad of an adjacent die. Moreover, the plurality of shunts 40 also provide a direct path between the non-ground resonator elements (e.g., the drive/sense electrode 27 and the resonant element 26). An alignment aid 46 unrelated to the disclosed protection techniques and designs is also shown in FIG. 2 at the intersection of the scribe lines 22, 24.

The shunt arrangement shown in FIGS. 1 and 2 takes advantage of the different bond pads located at each corner interface in the grid pattern. That is, the identical layout of each die 20 leads to four different bond pads at or near each corner interface. Despite this advantage, alternative shunt arrangements may connect bond pads across the scribe lines in a wide variety of configurations for compatibility with any number of device layouts. Thus, the disclosed devices and methods are not limited to die-scribe shunts located near corner intersections of adjacent dice.

The shunt arrangement shown in FIGS. 1 and 2 is exemplary in several ways. In this case, each resonator element is directly shunted to resonator elements residing on other dice. Further shunts along the scribe lines may alternatively or additionally connect resonator elements residing on the same die. For instance, further shunts may be included along and across each scribe line 22, 24 to connect two bond pads on the same die that are proximate the scribe line. As shown in one of the examples described below, these further shunts may include one or more lines or line sections running along or parallel to the scribe line with at least a portion or section of the line disposed entirely on the adjacent die. In that way, the shunt is disabled upon die singulation.

Despite the flexibility for alternative arrangements, the four-pad device layout shown in FIGS. 1 and 2 is particularly well-suited for short, effective connections between the bond pads. Because each of these connections will be entirely outside of the packaging encapsulating the central device region 30, each of the shunts 42, 44 may be configured as low-resistance conductors. That is, the width, height, material, and other characteristics of the shunts 42, 44 need not be limited by other considerations involving the packaging or vacuum encapsulation of the central device region 30. However, practice of the disclosed techniques is not limited to four-pad device layouts, and some embodiments may include shunts providing connections in closer proximity to the resonator elements—a design tradeoff with the short, low-resistance shunts of the example of FIGS. 1 and 2. Examples addressing these considerations are set forth below.

More generally, the shunts 42, 44 may be formed with any desired conductive material or combination of materials. In some cases, the shunts 42, 44 are formed during the fabrication steps that deposit a polysilicon layer for the microstructures of the resonant element 32 and the electrode 34. Alternatively or additionally, the shunts 42, 44 are formed during a metallization step.

Figure 3:
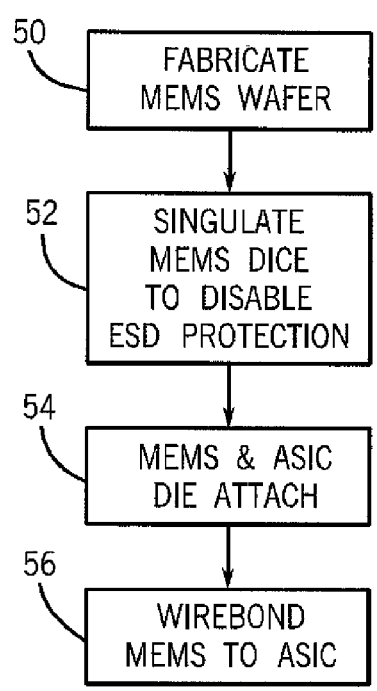
FIG. 3 is a flow diagram of an exemplary MEMS resonator device fabrication sequence in which the die-scribe shunts of FIGS. 1 and 2 are disabled in accordance with one aspect of the disclosure.

FIG. 3 shows an exemplary process flow in which the shunts 42, 44 are disabled via cuts made during die singulation or dicing. In this example, wafer-level fabrication of the MEMS devices is performed in a step 50, which includes fabrication of the shunt arrangement. The shunts 42, 44 may be created early in the fabrication sequence of the step 50 (e.g., before the resonant element microstructure 32 is released) to provide a long period of protection. More generally, and in this example, the shunts 42, 44 may be formed at any time during the step 50, insofar as they reside outside of the device packaging.

Figure 7:
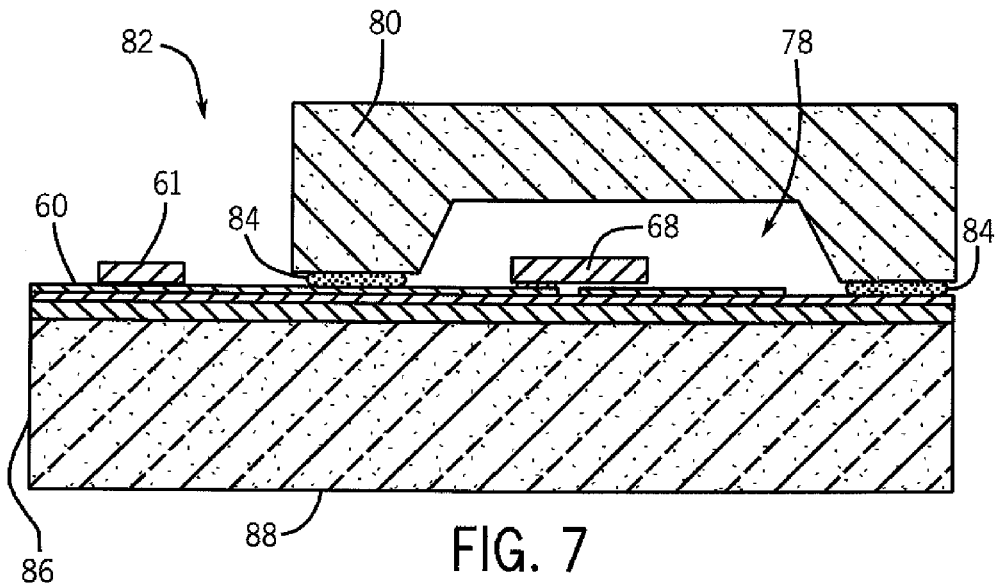
FIG. 7 is a schematic, cross-sectional representation of one of the exemplary MEMS resonator devices of FIG. 4 with a disabled shunt.

Eventually, the MEMS dice are singulated in a step 52, thereby disabling the protection provided by the shunt arrangement. The shunts are disabled by the cuts along the scribe lines 22, 24, as described above. As can be seen via FIGS. 1 and 2, the cuts result in termination of the shunts at edges of the die, leaving the other, opposite end of each disabled shunt still coupled to a respective bond pad. The die edges generally correspond with the edges of the supporting substrate, as shown in the example of FIG. 7.

The fabrication of the MEMS device may then include an assembly step 54 for attachment of the die 20 having the resonator elements to a integrated circuit (IC) die (not shown), such as an application-specific IC or ASIC. In some cases, a wire bonding step 56 follows the die attachment step 54.

The exemplary embodiment of FIGS. 1 and 2 generally protects the MEMS resonator device from damage arising from charge imbalances during the step 50. In some cases, the potential for damage is primarily during the step 50. Indeed, the subsequent steps 54, 56 may be rather limited or straightforward for some MEMS resonator devices. In other cases, the shunt arrangement shown in FIGS. 1 and 2 may be combined with one or more of the exemplary embodiments described below to provide protection throughout the fabrication process.

Figure 4:
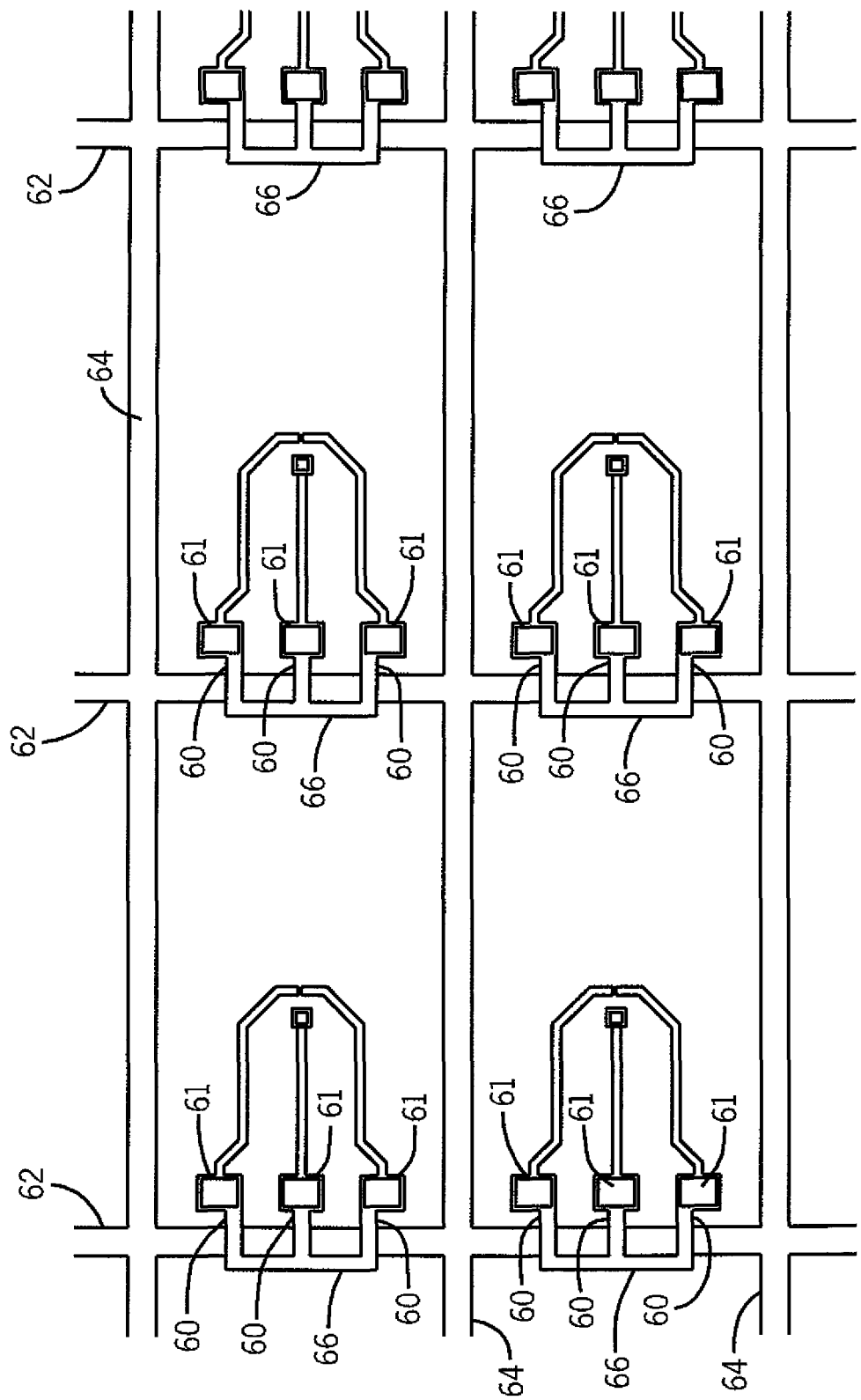
FIG. 4 is a schematic representation of a wafer array of exemplary MEMS resonator devices having a shunt arrangement in which bonds of one of the devices are connected across a die scribe line in accordance with one embodiment.
Figure 5:
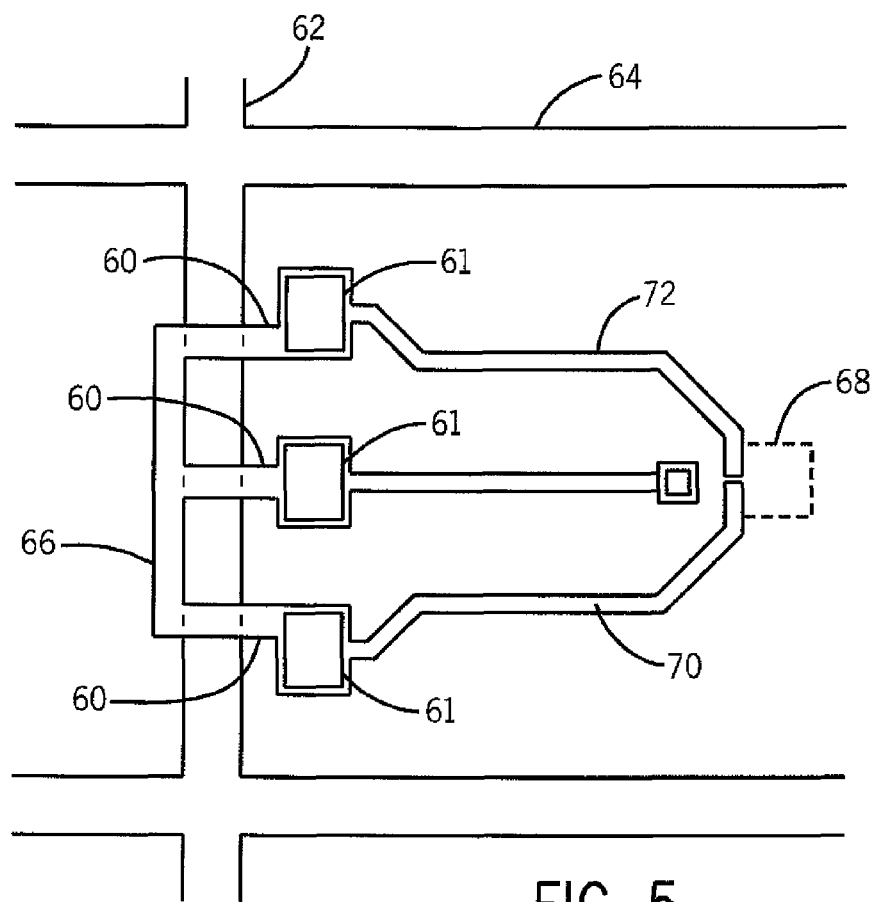
FIG. 5 is a schematic representation of one of the exemplary MEMS resonator devices of FIG. 4 to show the shunts of the MEMS resonator device crossing a die scribe line in greater detail.

FIGS. 4 and 5 show another exemplary shunt arrangement. This arrangement is shown in connection with a three-pad device layout, but may be applied to a device layout having any number or arrangement of bond pads. In this case, three shunts 60 are coupled to respective bond pads 61, one for each of the resonator elements (e.g., ground, the resonant element, and the drive/sense electrode). Each shunt 60 crosses a die scribe line 62 for termination during singulation. Die scribe lines 64 are not used to disable the shunts 60 in this example. An interconnecting line 66 of the shunt arrangement couples each of the shunts 60 on the other side of the scribe line 62 (i.e., on an adjacent die). In this way, the interconnecting shunt line 66 and the three shunts 60 coupled to the bond pads form an E-shaped shunt pattern.

In this case, all three bond pads 61 of each die are disposed along the scribe line 62, which advantageously provides a direct connection between the device elements of the same die. The arrangement may also be advantageous as space conservation technique, as it may lead to a more compact device layout. The arrangement may still further facilitate the packaging or encapsulation of the device region, inasmuch as all of the interconnects between the bond pads 61 and the device elements will pass under the packaging on the same side and in the same direction. FIG. 5 schematically shows the device elements of this example in greater detail. Specifically, the resonant element includes a microstructure 68 coupled to one of two interconnects 70, 72 to receive a bias voltage, and spaced from a microstructure (not shown) of the drive/sense electrode coupled to the other interconnect.

In some cases, the shunt arrangement shown in FIGS. 4 and 5 may be modified to include a connective shunt (not shown) that connects the line 66 between adjacent dice. The connective shunts therefore cross the die scribe lines 64 and are disabled as described above. Until then, the connective shunts provide additional paths to ground, establishing a shunt network involving multiple dice as in the examples described above.

Figure 6:
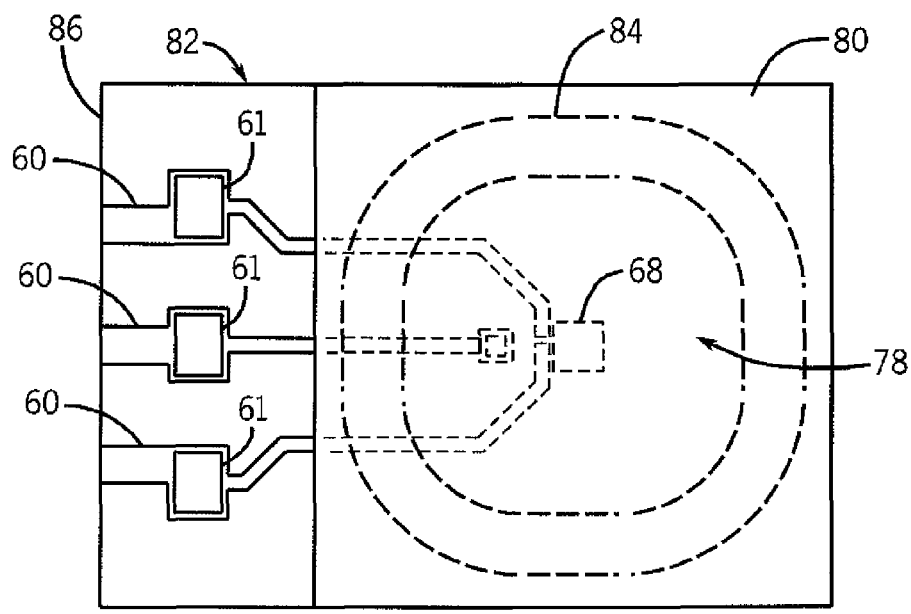
FIG. 6 is a schematic representation of one of the exemplary MEMS resonator devices of FIG. 4 having shunts disabled in accordance with the fabrication sequence of FIG. 3.

FIGS. 6 and 7 show embodiments similar to the exemplary embodiment of FIGS. 4 and 5 after a dicing step that disables each of the shunts 60. Like elements have been identified with like reference numerals despite the slight differences between the device layouts. In each case, a central device region indicated generally at 78 has been encapsulated by a cap 80 that leaves a bond pad section 82 of the die uncovered. A glass frit seal 84 may be used to form a hermetic seal for the device region under the cap 80. With the dicing step, the shunts 60 are disabled via termination at an edge 86 of the bond pad section 82 of the die. As described above, the edge 86 corresponds with the edge of a substrate 88 (FIG. 7) upon which the components of the MEMS resonator device are supported.

Described below are a number of embodiments directed to providing protection beyond die singulation. One or more of these embodiments may be combined to any desired extent with the embodiments described above.

In accordance with some aspects of the disclosure, protection is provided by one or more fuse shunts to be permanently electrically removed (or disabled) prior to operation by sending a current through the shunt. This disabling step effectively creates an open circuit in the shunt without causing damage to the resonator. In cases only having fuse shunts, the layout, patterning and positioning of the shunts are not complicated by the need to cross the scribe lines. This design flexibility allows the shunts to be placed closer to the device elements especially sensitive to charge imbalances, such as the resonant element and the drive/sense electrode.

The embodiments described below generally involve one or more shunts, each having a section or link with a fuse. While these shunts are generally configured for permanent removal via a disabling current, until that time, however, the shunts provide a low-resistivity bypass path to prevent charge imbalances or to handle current arising from charge imbalances. In some cases, the resistance provided by the fuse link section of the shunts may present a reason to combine the fuse shunt technique with one or more of the other techniques described herein.

Figure 8:
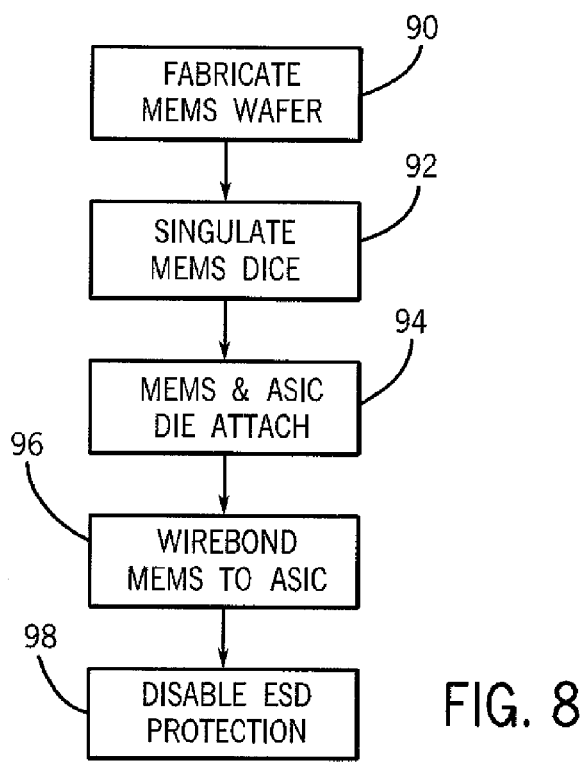
FIG. 8 is a flow diagram of an exemplary MEMS resonator device fabrication sequence in which fuse shunts are disabled in accordance with another aspect of the disclosure.

With reference now to FIG. 8, an exemplary fabrication sequence is set forth to show how fuse-based techniques may beneficially extend protection throughout the fabrication and assembly processes. The MEMS device wafer is fabricated in a step 90, during which each of the above-described microstructures and other device components are formed, as desired, including any number or type of protective shunts. Some of the shunts are fuse shunts, as described below. The wafer is then diced in a step 92, and the resulting dice are attached to respective ASIC dice in a step 94. The control circuitry in the ASICs may then be connected to the resonator device components via a wire bonding step 96.

At any point thereafter, the fuse shunts may be disabled via a current generated by, for instance, a pulse generator in the control circuitry. In fact, the fuse shunts may be blown at any desired time via the application of a suitable voltage (or current), and need not involve the ASIC or other control circuitry that ultimately is integrated into the MEMS resonator device. However, the exemplary process flow of FIG. 8 shows the shunts being disabled after assembly of the MEMS die to an ASIC die that may provide further protection. That is, this approach has the advantage that the resonator ESD protection may be left in place until after bonding to the ASIC, at which point ESD protection built into the ASIC may take over. This fabrication technique also generally allows any given device on a device wafer to be probed at any point in the process flow.

Figure 9:
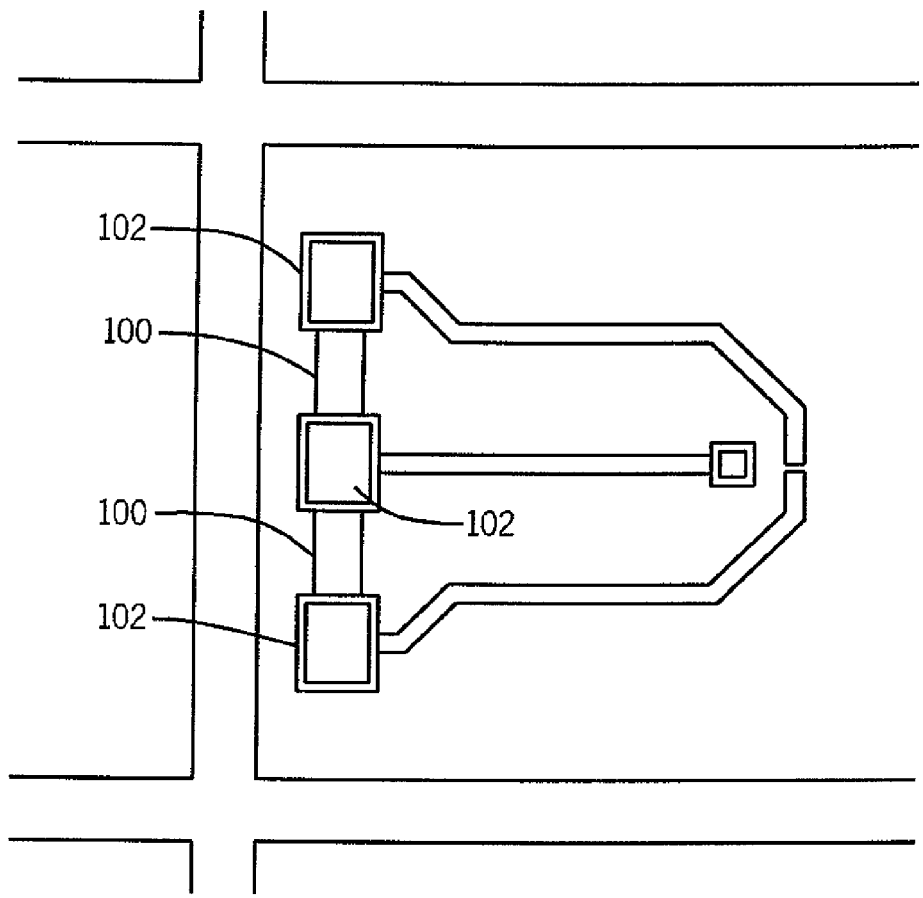
FIG. 9 is a schematic representation of an exemplary MEMS resonator device having bond pads connected by fuse shunts in accordance with an embodiment suitable for use with, for instance, the fabrication sequence of FIG. 8.

FIG. 9 shows one example of a fuse-based shunt arrangement. In this case, fuse shunts 100 couple bond pads 102 corresponding with the resonator device elements described above. As in the above-described scribe-cut embodiments, the shunts 100 may include any conductive material or combination of materials. In some cases, it may be useful to select the material(s) and otherwise configure (e.g., narrow) the shunts 100 to facilitate the creation of an open circuit via an appropriate disabling current. That is, the ease with which the shunts 100 are disabled via the current may help avoid damage to the resonator. For example, it may be useful in some cases to lower the resistivity of a shunt connection (or a portion thereof) relative to other conductive lines.

The arrangement of the fuse shunts 100 and the bond pads 102 is only exemplary. The fuse shunts 100 need not be disposed along a scribe line with the bond pads 102. Indeed, the fuse shunts 100 may be located anywhere on the die. For instance, the fuse shunts 100 may be disposed with the device elements inside the sealed enclosure (see, e.g., FIGS. 6 and 7). Such internal placement may be desirable in situations where close proximity to the resonator elements (e.g., the resonant element microstructure) is advantageous. Internal placement may also be desirable in the sense that the conductive paths that carry current or charge away from the resonator elements need not include interconnects or lines coupling the resonator elements to the bond pads. These interconnects may, in some cases, be narrow and/or thin to facilitate a pass under the cap seal. In other words, taller interconnects may provide sealing challenges. When the charge imbalance is forced through the short (or thin) interconnects, the resistivity of the interconnects may become a limiting factor for the protection.

Figure 10:
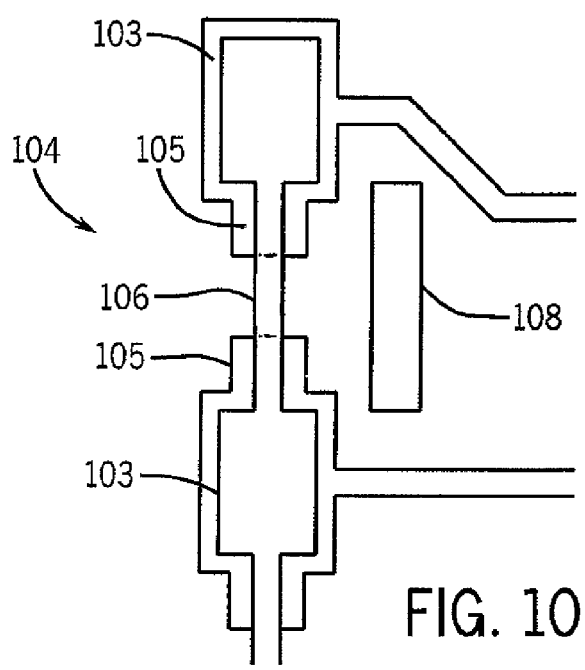
FIGS. 10 and 10A are top and cross-sectional, schematic representations of an exemplary fuse shunt with an air bridge and a splatter shield in accordance with further aspects of the disclosure.
Figure 10A:
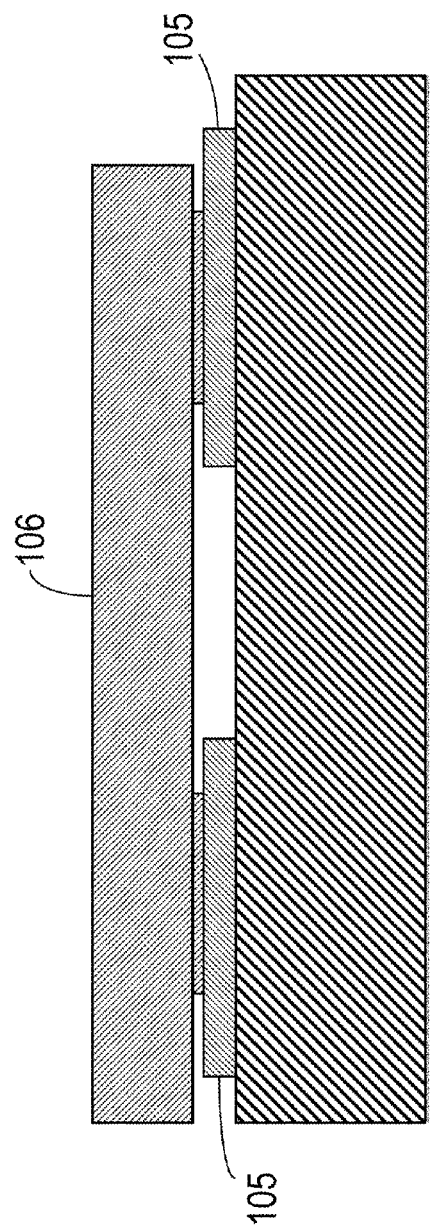

FIG. 10 shows one example of a fuse shunt that may be useful in cases where the fuse shunts are disposed in close proximity to the resonator elements (e.g., within the sealed enclosure). In this example, two conductive structures 103 coupled to respective resonator elements are, in turn, coupled by a fuse shunt generally indicated at 104. The conductive structures 103 may, but need not, be similar to bond pads. For example, each structure may include a metal layer deposited upon a polysilicon layer that also forms the interconnect lines to the resonator elements. Both of these layers may also extend to form portions of the fuse shunt 104. Specifically, the polysilicon layer may form one or more base or foundation sections 105 between which a metal air-bridge link 106 extends (as also shown in FIG. 10A). In this way, the link 106 is spaced from the underlying substrate or layer by air (or some other ambient gas). Alternative embodiments may utilize any one or more materials for the air-bridge link 106. For instance, the foundation sections 105 that support the link 106 need not be conductive. Indeed, the foundation sections 105 may not be present in some cases. More generally, the air-bridge link 106 is thermally isolated from the underlying layers (e.g., the substrate) to help prevent dissipation of the heat arising from the disabling current and may be otherwise configured (e.g., narrowed) to allow the fuse 104 to be disabled at a low voltage or current. In this way, the application of the disabling voltage will not harm any nearby resonator elements, interconnects or other device components.

The exemplary embodiment of FIG. 10 also includes one or more shields 108 to protect the resonator elements from debris generated when the fuse 104 is blown. In this way, the shield 108 may be configured as a splatter shield. The shield 108 may be formed from any material and have any desired shape, including, for instance, a dam to block or contain the flow of any melted material. The shield 108 may be useful when the fuse 104 is especially close to the resonant element microstructure and the gap in which the resonant displacement occurs. Any debris from the fuse 104 may be detrimentally significant in view of the small size of the gap.

In accordance with yet another aspect of the disclosure, some embodiments include shunts that can be laser-cut. This approach takes advantage of existing laser-trimming and link-blowing technology commonly used in the manufacture of electronic devices. Like the fuse shunts, the shunt may be disabled at any desired time, and for any given device. Moreover, the choice of materials may be less restrictive than in other embodiments because the shunts are laser cut rather than impacted by a disabling current.

FIGS. 11A-11C are generally directed to an aspect of the disclosure involving yet another type of shunt for protection in connection with a backside wafer fabrication technique. In these cases, the shunt includes a substrate path that exists through a backside grinding step in the fabrication sequence. To this end, the substrate may have a suitably low-resistivity, such as $10^{-3}$ Ohm-cm.

Unlike the fabrication sequences and device designs described above, the embodiments of FIGS. 11A-11C dispose device elements and components on both sides of a substrate 110. Specifically, a resonant element microstructure 112, a drive/sense electrode microstructure 114, and various other supporting and connective structures are disposed on a front side 116, while bond pads 118 are deposited on a back side 120 after a backside grinding step. Generally speaking, this approach may simplify the packaging or vacuum encapsulation of the MEMS components with a cap 122 mounted to the front side 116 without the complications of a frit sealing ring and/or conductive lines breaching a sealing ring.

During fabrication, the microstructures 112 and 114 are initially shorted to the substrate 110 (FIG. 11A) as shown. That is, the substrate 110 provides a shunt between the microstructures 112 and 114 to provide protection. A concern is that the substrate wafer can acquire a charge during a back grinding step (or from a back grinding wheel) used to isolate the elements to enable operation, as shown in FIG. 11B. Specifically, the back side 118 is removed to a point where isolating trenches 124 are reached, at which point the shunts are disabled. The metallization and other steps involved in providing interconnects and bond pads are then implemented to reach the device configuration shown in FIG. 11C.

One way to provide further protection after the back grinding step involves the formation of fuse shunts inside the sealed device cavity (i.e., under the cap 122 on the front side 116) in accordance with the techniques described above. Another option is shown in FIG. 12, in which an SOI wafer indicated generally at 130 is used to form a dual-sided device arrangement similar to that shown in FIGS. 11A-11C. In this case, however, an insulator layer 132 of the wafer 130 separates a handling wafer 134 from a substrate 136. In so doing, no path through the substrate 136 forms a shunt, but the resonator elements are not in electrical contact with the grinding wheel that eventually removes the handling wafer 134. Again, this approach may be combined with, for instance, a fuse shunt arrangement to provide protection beyond the back grinding step.

Described herein are a variety of shunts and shunt configurations to protect MEMS resonator devices. In some cases, the shunts connect the free and fixed resonator elements to the same potential. Such shunts may, for instance, connect the free and fixed resonator elements to a common node or ground, thereby allowing any undesirable current or charge to be shunted harmlessly away from the resonator device. Some embodiments include one or more shunts that cross, or are otherwise disposed or placed along, the die scribe lines so as to be disabled during a die singulation step. Each shunt may serve as a temporary, sacrificial connection between two or more elements of the resonator device. The presence of these shunts offers ESD protection through the various process steps until singulation, at which point they are cut along the scribe lines. Once the shunts are cut, the protection is removed. Alternatively or additionally, the shunts include fuse or include fuse links to provide protection beyond singulation. Such shunts may be disabled by application of a voltage low enough so as not to cause damage to the resonator. In some cases, the fuse portion of such shunts includes an air-bridge. In accordance with some fabrication techniques, the shunts may alternatively or additionally be laser-cut.

Testing of MEMS resonator devices with simulated shunts has indicated that the ESD damage threshold has been raised significantly via implementation of the disclosed techniques and designs. In addition, designs with the disclosed ESD protection techniques may also be more robust by helping reduce the electrostatic attraction of small particles that may be present either before or after packaging.

The disclosed devices and methods are well-suited for use with a variety of MEMS resonators. Thus, application of the disclosed designs and fabrication techniques is not limited to any one type of MEMS resonator. Indeed, the resonant element may be configured in any desired fashion.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A MEMS resonator device, comprising:
a substrate;
an electrode comprising a first microstructure supported by the substrate;
an electro-mechanically resonant element comprising a second microstructure spaced from the first microstructure by a gap and configured for mechanical, resonant vibration of the second microstructure that varies the gap during operation;
a disabled shunt coupled to the electrode or the resonant element, the disabled shunt being disabled to enable the resonant vibration but otherwise configured to protect the electrode and the resonant element from damage from an electrostatic charge imbalance before the operation of the MEMS resonator device; and
a cap mounted to the substrate to define a sealed cavity in which the electrode, the resonant element, and the disabled shunt are enclosed;
wherein the disabled shunt comprises a fuse link spaced from the substrate by a gas within the sealed cavity.

2. The MEMS resonator device of claim 1, further comprising a splatter shield supported by the substrate and configured to protect the first microstructure or the second microstructure from debris generated when the fuse link is blown.

3. The MEMS resonator device of claim 1, wherein:
the first and second microstructures are shorted to the substrate; and
the substrate includes an isolating trench configured to isolate the first and second microstructures from one another.

4. The MEMS resonator device of claim 1, wherein the disabled shunt further comprises a pair of non-conductive foundations between which the fuse link extends.

5. The MEMS resonator device of claim 1, wherein the disabled shunt further comprises a pair of polysilicon foundations between which the fuse link extends.

6. The MEMS resonator device of claim 5, wherein the fuse link comprises metal.

7. The MEMS resonator device of claim 1, wherein the fuse link is thermally isolated from the substrate.

8. A MEMS resonator device comprising:
a substrate;
an electrode comprising a first microstructure supported by the substrate;
a resonant element comprising a second microstructure spaced from the first microstructure by a gap and configured for resonant vibration of the second microstructure that varies the gap during operation;
a cap mounted to the substrate to define a sealed cavity in which the electrode and the resonant element are enclosed; and
a disabled shunt coupled to the electrode or the resonant element, the disabled shunt being disabled to enable the resonant vibration but otherwise configured to protect the electrode and the resonant element from damage from an electrostatic charge imbalance before the operation of the MEMS resonator device;
wherein the disabled shunt is enclosed within the sealed cavity.

9. The MEMS resonator device of claim 8, wherein the disabled shunt comprises a fuse, and wherein the fuse is configured as an air bridge.

10. The MEMS resonator device of claim 9, wherein the disabled shunt further comprises a pair of non-conductive foundations between which the air bridge extends.

11. The MEMS resonator device of claim 9, wherein the disabled shunt further comprises a pair of polysilicon foundations between which the air bridge extends.

12. The MEMS resonator device of claim 11, wherein the air bridge comprises metal.

13. The MEMS resonator device of claim 9, wherein the air bridge is thermally isolated from the substrate.

14. The MEMS resonator device of claim 8, wherein the disabled shunt comprises a fuse, and wherein the MEMS resonator device further comprises a splatter shield supported by the substrate and configured to protect the first microstructure or the second microstructure from debris generated when the fuse is blown.

15. The MEMS resonator device of claim 8, wherein:
the first and second microstructures are shorted to the substrate; and
the substrate includes an isolating trench configured to isolate the first and second microstructures from one another.

* * * * *